(12) United States Patent
Paul et al.

(10) Patent No.: US 11,099,250 B2
(45) Date of Patent: Aug. 24, 2021

(54) METHOD AND APPARATUS FOR GENERATING A MAGNETIC RESONANCE DATA RECORD

(71) Applicant: Siemens Healthcare GmbH, Erlangen (DE)

(72) Inventors: Dominik Paul, Bubenreuth (DE); Flavio Carinci, Erlangen (DE); Daniel Nico Splitthoff, Uttenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 319 days.

(21) Appl. No.: 16/213,110

(22) Filed: Dec. 7, 2018

(65) Prior Publication Data

US 2019/0178966 A1   Jun. 13, 2019

(30) Foreign Application Priority Data

Dec. 7, 2017   (DE) .......................... 102017222141.0

(51) Int. Cl.
*G01R 33/60* (2006.01)
*G01R 33/54* (2006.01)
*G01R 33/483* (2006.01)
*G01R 33/565* (2006.01)
*G01R 33/56* (2006.01)
(Continued)

(52) U.S. Cl.
CPC ....... *G01R 33/543* (2013.01); *G01R 33/4838* (2013.01); *G01R 33/565* (2013.01); *G01R 33/5608* (2013.01); *G01R 33/485* (2013.01); *G01R 33/4835* (2013.01); *G01R 33/5613* (2013.01)

(58) Field of Classification Search
CPC .............. G01R 33/543; G01R 33/5608; G01R 33/5607; G01R 33/4828; G01R 33/4835; G01R 33/3415; G01R 33/283; G01R 33/307; G01R 33/60; G01R 33/50; G01V 3/32; E21B 49/08; E21B 2049/085; G01N 24/10
See application file for complete search history.

(56) References Cited

U.S. PATENT DOCUMENTS 5,237,273 A * 8/1993 Plewes ............... G01R 33/4835
324/307
2014/0159723 A1* 6/2014 Neji ..................... G01R 33/483
324/309

(Continued)

OTHER PUBLICATIONS

Zhao, et al. "Simultaneous Fat Saturation and Magnetization Transfer Contrast Imaging with Steady-State Incoherent Sequences," Magnetic Resonance in Medicine, vol. 74, pp. 739-746, (2015).

(Continued)

*Primary Examiner* — Jermele M Hollington
*Assistant Examiner* — Taqi R Nasir
(74) *Attorney, Agent, or Firm* — Schiff Hardin LLP (57) ABSTRACT

In a method and apparatus for generating a magnetic resonance data record, at least two excitation cycles are executed, wherein, in each excitation cycle, at least one magnetic resonance signal is recorded, using different phases with a first radio-frequency pulse in two consecutive excitation cycles, with at least one dephasing gradient being applied in an excitation cycle.

15 Claims, 5 Drawing Sheets

(51) Int. Cl.
G01R 33/485 (2006.01)
G01R 33/561 (2006.01)

(56) References Cited

U.S. PATENT DOCUMENTS

2016/0282430 A1* 9/2016 Gulani ............... G01R 33/4828
2017/0030986 A1* 2/2017 James ............... G01R 33/5602

OTHER PUBLICATIONS

Elster, "Gradient-Echo MR Imaging: Techniques and Acronyms," Radiology, vol. 186, No. 1, pp. 1-8, (1993).

* cited by examiner

| A | P | $D_R$ | $D_P$ | $D_S$ |
|---|---|---|---|---|
| 1 | 0 | 40 | 40 | 40 |
| 2 | 117 | 75 | 75 | 75 |
| 3 | 351 | 57 | 57 | 57 |
| ... | ... | ... | ... | ... |

FIG 8

| S | A | P |
|---|---|---|
| 1 | 1 | 0 |
| 2 | 1 | 0 |
| 3 | 1 | 0 |
| 1 | 2 | 117 |
| 2 | 2 | 0 |
| 3 | 2 | 0 |
| 1 | 3 | 351 |
| 2 | 3 | 0 |
| 3 | 3 | 0 |
| ... | ... | ... |

FIG 9

| S | A | P1 | P2 |
|---|---|---|---|
|  |  | 0 | X |
| 1 | 1 | 0 | X+117° |
| 2 | 1 | 117° | X+117° |
| 3 | 1 | 117° | X+351° |
| 1 | 2 | 351° | X+351° |
| 2 | 2 | 351° | X+342° |
| 3 | 2 | 342° | X+342° |
| ... | ... | ... | ... |

FIG 10

| S | A | P | $D_R$ | $D_P$ | $D_S$ |
|---|---|---|---|---|---|
| 1 | 1 | 0 | 40 | 49 | 67 |
| 2 | 1 | 90 | 33 | 45 | 54 |
| 3 | 1 | 180 | 57 | 38 | 50 |
| 1 | 2 | 117 | 44 | 62 | 43 |
| 2 | 2 | 207 | 40 | 49 | 67 |
| 3 | 2 | 297 | 33 | 45 | 54 |
| 1 | 3 | 351 | 57 | 38 | 50 |
| 2 | 3 | 81 | 44 | 62 | 43 |
| 3 | 3 | 171 | 40 | 49 | 67 |
| ... | ... | ... | ... | ... | ... |

METHOD AND APPARATUS FOR GENERATING A MAGNETIC RESONANCE DATA RECORD

BACKGROUND OF THE INVENTION

Field of the Invention

The present invention concerns a method and an apparatus for generating a magnetic resonance (MR) data record of the type wherein an MR data acquisition scanner is operated so as to execute at least two excitation cycles, with at least one MR signal being recorded (acquired) in each excitation cycle

Description of the Prior Art

In order to acquire MR signals from a subject, the subject is placed in a strong, homogeneous basic magnetic field that causes nuclear spins of atoms within the subject to be aligned along the basic magnetic field. Radio-frequency (RF) pulses are emitted that give certain nuclear spins in the subject a magnetization that causes those nuclear spins to be deflected from the aforementioned alignment, by an amount known as a flip angle. As these excited nuclear spins and relax and return to the steady-state condition, they emit further RF signals, called MR signals. Gradient fields are applied by activating gradient pulses, so as to spatially encode the MR signals. The acquired MR signals are transformed in a known manner into image data that form an image of at least a portion of the subject.

Techniques for acquiring MR signals are known wherein multiple excitations of the nuclear spins are produced.

As a result of the repeated application of radio-frequency pulses and gradient fields, unintended signal generation can arise in magnetic resonance sequences. In order to follow the route of a signal so as to sue the signals to identify a point of origin to the subject, coherence paths can be observed.

This procedure has the disadvantage that a sequence can only be assessed with the existing parameters.

A particular problem is presented by so-called "modules". Modules are building blocks that can be incorporated into many different sequences. Thus diffusion modules for diffusion weighting, inversion modules for inverting the magnetization or flow modules for generating a flow speed-dependent preparation of the magnetization are known. Modules are usually sequences of radio-frequency pulses, gradient fields and waiting times, also known as delays. Acquisition windows normally do not contain such waiting times, although this is not precluded.

These modules can also be designated as preparation modules. They are used in order to generate a desired image contrast.

A diffusion module can contain, inter alia, bipolar gradients in order to achieve a diffusion weighting.

In many magnetic resonance sequences, saturation modules are used. A saturation module is used in order to eliminate the magnetization of the nuclear spins at a defined time point. It contains at least one excitation pulse and at least one gradient. This gradient is applied after the excitation pulse and is configured so that it eliminates the transverse magnetization. This gradient is therefore also referred to as a spoiler gradient or a dephasing gradient.

When such modules are used, and specifically the saturation modules, a number of parameters can be changed. A selection can be made as to whether and which pulse profile a radio-frequency pulse will have, the flip angle can be set, the gradient durations and amplitudes of the gradient fields used can be exchanged, etc.

If one or more modules are used in the recording of a data record, a determination of the coherence paths in advance is not possible, or only with restrictions. Therefore, an undesirable generation of signals can arise, which are either contained as an interference signal in the scan data, or extinguish the desired signal.

SUMMARY OF THE INVENTION

An object of the present invention is to provide a method with which less fault-prone scan data recording is possible.

This object is achieved in accordance with the invention by a method for generating a magnetic resonance data record wherein a computer operates an MR data acquisition scanner so as to execute at least two excitation cycles in the data acquisition scanner so that, with each excitation cycle, at least one magnetic resonance signal being recorded in each excitation cycle.

Different phases are used in a first radio-frequency pulse, as the excitation pulse, in two successive excitation cycles.

The computer also operates the MR scanner so as to apply (activate) at least one dephasing gradient in an excitation cycle.

The acquired MR signals are entered into a memory as raw MR data and the contents of the memory are made available from the computer in electronic form, as a data file, for further processing. Such further processing can include transforming the acquired MR raw data in a known manner so as produce image data, by implementing a reconstruction algorithm. The image data can also be made available from the computer in electronic form as a data file, for presentation at a display screen or for archiving.

The basis of the invention is to carry out an RF spoiling and a gradient spoiling simultaneously in one sequence. This is not restricted to sequences making use of a module.

An RF spoiling is carried out by, in different excitation cycles, for at least one of the excitation pulses, different phases are used. In the most general form, at least once during the entire measuring duration, the phase is exchanged.

The excitation pulse can have a very small flip angle, as in a FLASH sequence. FLASH is an acronym for Fast Low Angle SHot. Therein, short repetition times with excitation angles of significantly less than 90° are combined. However the excitation pulse can also have a flip angle of greater than 90°, as can be the case with a saturation pulse. The excitation pulse is, however, not a refocusing pulse. A refocusing pulse is a radio-frequency pulse with a flip angle of 180°. It should be noted that each radio-frequency pulse that does not flip exactly by 90° (and thus in practice every radio-frequency pulse), has a refocusing portion, but its flip angle is nevertheless not equal to 180°.

Alternatively, the first radio-frequency pulse can be configured as an adiabatic radio-frequency pulse.

In addition to this RF spoiling used for at least one excitation pulse, at least one dephasing gradient is applied. A dephasing gradient serves, as described above, to eliminate the transverse magnetization. It must be configured such that neither it itself nor another gradient brings about a rephasing. This can involve a gradient in one of the three directions of the recording coordinate system, for example a gradient in the reading direction, in the phase direction or in the slice direction.

The dephasing gradient can follow directly, or with a waiting time after the excitation pulse. If, simultaneously with the excitation pulse, a slice selection gradient is applied, it can be extended beyond the duration of the excitation pulse. The slice selection gradient transitions in this embodiment directly into the dephasing gradient.

As used herein, a scan sequence means, as usual, a sequence of RF pulses, gradient fields, waiting times and acquisition windows that precisely define and characterize the progress of the generation and acquisition of MR signals.

A scan sequence is composed of defined or definable components, which can also be designated an excitation cycle. In the case of a spin echo, as many excitation pulses are applied as phase-encoded steps are carried out. The number of the refocusing pulses then also corresponds to the number of excitation pulses and the number of excitation cycles.

In the case of a turbo spin echo, however, a number of refocusing pulses is applied in an excitation cycle, so as to produce multiple echoes, referred to as an echo train. In the case of a turbo spin echo with 128 phase encoding steps and a total of 8 echoes in an echo train, there is therefore a count of only 16 excitation cycles for recording a complete scan data record.

The length of an excitation cycle is called the repetition time and is abbreviated "TR".

These statements regarding scan sequences, spin echo and repetition time are intended merely to explain the existing conventions in the field of magnetic resonance imaging.

An excitation cycle can have one or more modules. Modules for weighting the magnetization are typically present at the start of an excitation cycle. If a turbo spin echo has a saturation module, then this is also situated at the start thereof, specifically before the excitation pulse.

The at least one module can be, as described above, a preparation module such as a saturation module, a diffusion module, etc.

The at least one dephasing gradient can be applied directly following the first radio-frequency pulse. This means that directly after the first radio-frequency pulse, no other radio-frequency pulses, acquisition windows or gradient fields are applied. However, a waiting time can be provided. Preferably, however, no waiting time is provided. In particular, the dephasing gradient can be maintained by, as described above, extending a slice selection gradient beyond the application of the first radio-frequency pulse.

Preferably, the first radio-frequency pulse has a flip angle of 80° to 110°. Particularly if the first radio-frequency pulse is part of a saturation module, flip angles of greater than 90° can be used. Then the spacing from the next excitation pulse is selected so that the non-destroyed magnetization has its zero crossing in the longitudinal direction on application of the excitation pulse.

Preferably, in all the respective successive excitation cycles, different phases of the first radio-frequency pulse are used. This means that the phases of the first radio-frequency pulse differ in the first excitation cycle and the second excitation cycle. The phases in the second and third excitation cycles also differ. Therefore in two consecutive excitation cycles, different phases are always present. It can be the case, however, that in the first and the fifth excitation cycles, for example, the same phase occurs.

Preferably, a repetition of the phase of the first radio-frequency pulse occurs after at least ten excitation cycles. Alternatively, a repetition of the phase of the first radio-frequency pulse occurs after at least twenty excitation cycles. Further alternatively, a repetition of the phase of the first radio-frequency pulse occurs after at least sixty-four excitation cycles.

Preferably, the phase increment of the first radio-frequency pulse can be determined between two excitation cycles on the basis of a formula. Starting from the phase in the excitation cycle under consideration, therefore, the phase of the successive or the following excitation cycles is determined.

The phase change can be a multiple of 117°, wherein the multiplier depends on the position of the excitation cycle. The following applies:

$$\varphi_n = \alpha + \Sigma(n-1)*117°, \text{ where } n=1,2,3,\ldots,$$

Herein, $\alpha$ is the starting phase, for example, 90°. In other words with each excitation cycle, the phase increment is increased and the phase of the radio-frequency pulse is increased by the phase increment.

Preferably, the first radio-frequency pulse and the at least one dephasing gradient are present in a preparation module.

In a first alternative, the preparation module is a T2 preparation module. Another alternative is for the preparation module to be a magnetizing transfer module.

In another alternative, the first radio-frequency pulse and the at least one dephasing gradient form a saturation module. As described, this is a module for eliminating the magnetization at a defined point in time.

Because the at least one dephasing gradient eliminates only transverse magnetization, it may occur that, with an imperfect 90° radio-frequency pulse as the first radio-frequency pulse, residual magnetization still remains.

Therefore (without restriction to a saturation module or a 90° excitation pulse) in each excitation cycle, at least one second radio-frequency pulse can be applied in which the phases differ in at least two excitation cycles. All the embodiments described for the first radio-frequency pulse can also be present during the second radio-frequency pulse. Advantageously, the second phase-adjustable radio-frequency pulse has a different start phase from the first radio-frequency pulse.

Furthermore, in principle any desired number of radio-frequency pulses can occur in an excitation cycle in which the phases are altered in a defined manner.

Preferably, all the phase-adjustable radio-frequency pulses are present in a module. In particular, all the phase-adjustable radio-frequency pulses can be present in a saturation module. Preferably, none of these radio-frequency pulses is a refocusing pulse.

In addition, radio-frequency pulses that are not subject to a phase change can also be present in an excitation cycle. For example, a saturation module that contains one or up to four or more phase-adjustable radio-frequency pulses can be used as a preparation portion and as a read-out portion, a FLASH sequence which has a radio-frequency pulse with a predetermined phase.

Apart from the RF spoiling, gradient spoiling is also used, as described. In the simplest embodiment, it comprises an individual dephasing gradient. This is the same in all excitation cycles.

Preferably, two or three dephasing gradients can also be switched at least partially simultaneously. These are then applied in different spatial directions.

The following embodiments are described for a single dephasing gradient. They can be used on all or only a part of the existing dephasing gradients.

Preferably, the at least one dephasing gradient has a different gradient moment in at least two consecutive excitation cycles. The gradient moment is the product of the gradient duration and the gradient amplitude. It corresponds to the area under the gradient. Preferably, in order to change the gradient moment, the gradient amplitude is changed. Then, the timing of the sequence can remain unchanged. Herein, at least one change of the gradient moment during the sequence is provided.

Preferably, the at least one dephasing gradient has a different gradient moment in two consecutive excitation cycles. Then, a change of the gradient moment takes place between all the excitation cycles.

Preferably, a sequence of gradient moments is used. The sequence can be predetermined, or calculated dependent upon predetermined parameters. The length of the sequence can be fixed or can be adapted to the number of excitation cycles or the number of scan slices.

Preferably the sequence is used repeatedly. If the sequence is shorter than the number of excitation cycles, the sequence can be repeated partially or multiple times.

With the dephasing gradients as well, a similar procedure is used for RF spoiling of the radio-frequency pulses. Through the use of the gradient moments, in particular unwanted coherence paths can be suppressed.

Preferably, the smallest gradient moment of the dephasing gradient is at least half as large as the strongest gradient moment. If the strongest gradient amplitude is 500 mT, then a sequence can have gradient with the gradient amplitudes 400 mT, 335 mT, 495 mT and 265 mT. The gradient durations are assumed to be equally long. Then the gradient moment depends directly upon the gradient amplitude.

The gradient moments of the sequence can be specified such that they have no common parts. Thus, multiples of 25 mT or the like are not used, but rather a type of symmetry break is to take place.

The embodiments described have so far been targeted at a single scan slice. In the case of a number of scan slices, the scan signals are recorded interleaved and excitation cycles from a number of scan slices are overlaid.

In a first embodiment, the embodiments described can be selected and specified for each scan slice separately and independently.

In a second, alternative embodiment, the procedure in the slices can be matched to one another:

Preferably, scan signals are acquired from a number of slices and in a corresponding excitation cycle of a slice, only the gradient moment of the at least one dephasing gradient changed. This means that in the first excitation cycle of the slices, the radio-frequency pulses have the same phase and only the gradient moment changes.

If the phases and the gradient moments are denoted with an index wherein a deviating index indicates a deviating phase or a deviating gradient moment, in the implementation, the following table results:

Slice 1, excitation cycle 1: Phase 1, gradient moment 1
Slice 2, excitation cycle 1: Phase 1, gradient moment 2
Slice 3, excitation cycle 1: Phase 1, gradient moment 3
Slice 1, excitation cycle 2: Phase 2, gradient moment 4
Slice 2, excitation cycle 2: Phase 2, gradient moment 1
Slice 3, excitation cycle 2: Phase 2, gradient moment 2
Slice 1, excitation cycle 3: Phase 3, gradient moment 3
Slice 2, excitation cycle 3: Phase 3, gradient moment 4
Slice 3, excitation cycle 3: Phase 3, gradient moment 1

It can be seen that the phase is determined dependent upon the index of the excitation cycle, whereas the gradient moments follow a sequence. The length of the sequence, that is, the number of elements in the sequence can be specified so that it does not correspond to the number of layers.

The gradient moments of the individual dephasing gradients can be different, with only that the overall moment changes. A detailed view of individual dephasing gradients is also set out below.

The phases 2, 3, etc. can be determined on the basis of the formula set out above.

Considered for one slice, the phase then still always changes with each excitation cycle, although no account is taken, as it were, of the scan slices.

Preferably, therefore, for multi-slice scans, a sequence of gradient moments is used wherein the gradient moment changes on a change of slice. The length of the sequence is preferably not equal to the number of slices. In particular, the length of the sequence can be larger, for example larger by one, than the number of slices. In the case of three slices, therefore, the sequence has four elements.

The phase of the first radio-frequency pulse or all the phase-adjustable radio-frequency pulses can be varied analogously to the gradient moment of the dephasing gradient. Alternatively, as shown in the above table, the phase can be set dependent upon the number of the excitation cycle. Then a phase is repeated as often as there are slices present and is then changed.

As a further alternative, the phase of the first radio-frequency pulse or of all phase-adjustable radio-frequency pulses can be varied in only one slice and remain constant in all the others. Then, the following progression can result:

Slice 1, excitation cycle 1: Phase 1, gradient moment 1
Slice 2, excitation cycle 1: Phase 1, gradient moment 2
Slice 3, excitation cycle 1: Phase 1, gradient moment 3
Slice 1, excitation cycle 2: Phase 2, gradient moment 4
Slice 2, excitation cycle 2: Phase 1, gradient moment 1
Slice 3, excitation cycle 2: Phase 1, gradient moment 2
Slice 1, excitation cycle 3: Phase 3, gradient moment 3
Slice 2, excitation cycle 3: Phase 1, gradient moment 4
Slice 3, excitation cycle 3: Phase 1, gradient moment 1

Preferably, in each excitation cycle, at least one radio-frequency pulse with a constant phase can be used. As described, many problems arise due to modules the coherence paths of which are not determinable in advance. Constant phases can be used for the radio-frequency pulses that belong unchangingly to a sequence and of which the coherence path is specifiable.

The present invention also encompasses a non-transitory, computer-readable data storage medium encoded with programming instructions that, when the storage medium is loaded into a computer or computer system of an MR apparatus having an MR data acquisition scanner, cause the computer or computer system to operate the MR apparatus so as to implement any or all embodiments of the method according to the invention, as described above.

The invention also encompasses a magnetic resonance apparatus being an MR data acquisition scanner with a control computer configured to operate the scanner so as to implement the method according to the invention.

The implementation of the aforementioned method in the control computer can take place as software or as (hard-wired) hardware.

Embodiments of the magnetic resonance apparatus according to the invention correspond to the embodiments of the method according to the invention as described above.

DESCRIPTION OF THE PREFERRED EMBODIMENTS

Figure 1:
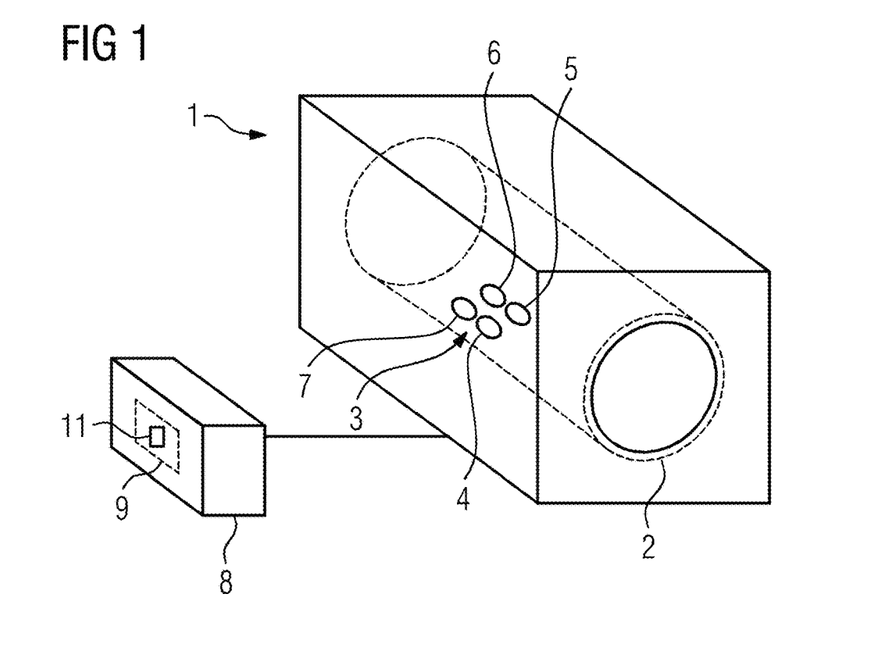
FIG. 1 schematically illustrates a magnetic resonance apparatus according to the invention.

FIG. 1 shows a magnetic resonance apparatus that has an MR data acquisition scanner 1 with a transmitting RF coil arrangement 2. The transmitting RF coil arrangement 2 can be configured as a body coil. Alternatively, the transmitting RF coil arrangement 2 can be a transmitting coil array. The transmitting coil arrangement 2 is shown dashed.

As a second coil arrangement, a receiving RF coil arrangement 3 for data acquisition is provided. The receiving RF coil arrangement 3 is preferably configured as a coil array with coils 4, 5, 6 and 7. The coils 4, 5, 6 and 7 record scan signals in parallel. By this parallel imaging, the scan time can be reduced.

In order to control the scan sequences, the magnetic resonance apparatus 1 has a control computer 8.

The magnetic resonance apparatus 1 further has a data carrier 9 as part of the control computer 8, or independent thereof, on which programs 11 for carrying out magnetic resonance scans are stored.

Further components of the magnetic resonance apparatus 1, such as gradient coils or a patient support are not shown for clarity.

Figure 2:
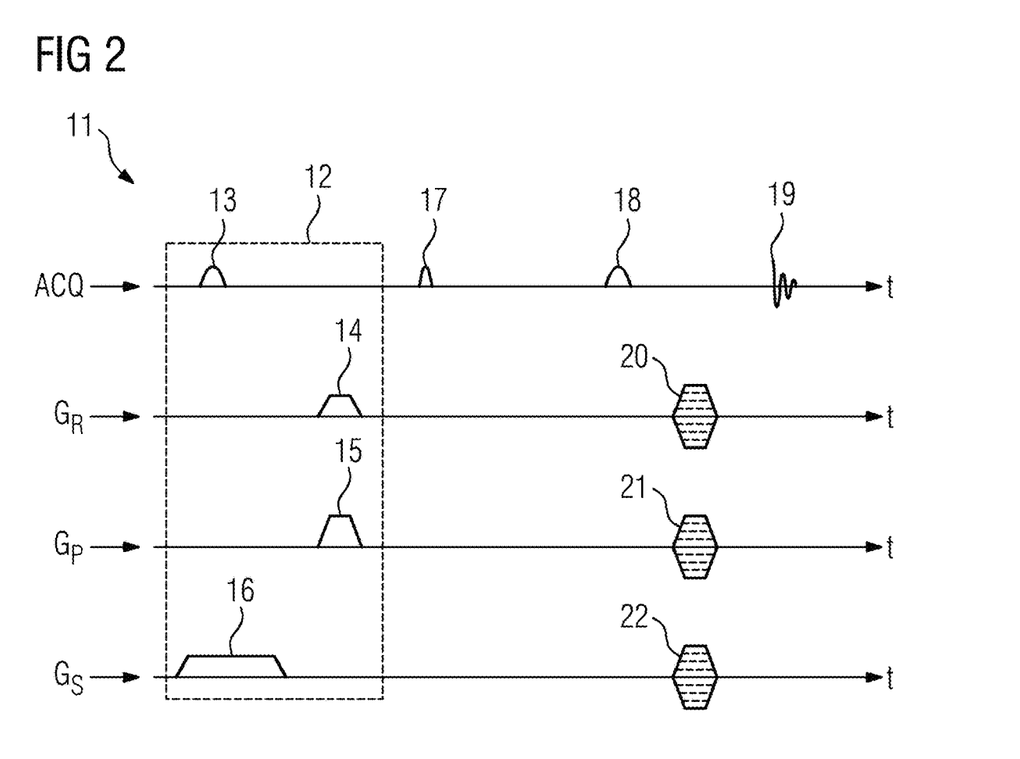
FIG. 2 shows a first scan sequence in accordance with the invention.

FIG. 2 shows a first sequence diagram 11. This relates to a recording method for recording a three-dimensional spectroscopic image data record. The axis labels are self-explanatory.

The sequence is constructed in a modular manner. The saturation module 12 contains a radio-frequency pulse 13 and a dephasing gradient 14, 15 and 16. The dephasing gradient 14 is applied in the reading direction $G_R$, the dephasing gradient 15 in the phase direction $G_P$ and the dephasing gradient 16 in the slice selection direction $G_s$. The dephasing gradient 16 herein has a double function. During the application of the radio-frequency pulse 13, it acts as a slice selection gradient, so that only spins of a pre-determined slice are excited. Thereafter, it dephases the magnetization.

A spectroscopic 3D spin echo sequence with a radio-frequency pulse 17 and a refocusing pulse 18 follows the saturation module 12. The last two pulses generate a spin echo 19.

For encoding the k-space, the sequence further has three phase encoding gradients 20, 21 and 22.

The radio-frequency pulse 13 as part of the saturation module 12 has a flip angle of 100° and is thus an excitation pulse. The radio-frequency pulse 17 has a flip angle of 90° and is also an excitation pulse. The refocusing pulse 18, however, has a flip angle of 180°. Furthermore, the refocusing pulse 18 can be phase-shifted relative to the radio-frequency pulse 17, in particular by 90°. The radio-frequency pulse 17 flips the magnetization, for example, by 90° in the x-direction and the refocusing pulse 18 by 180° in the y-direction, in each case in the rotating coordinate system.

Figure 6:
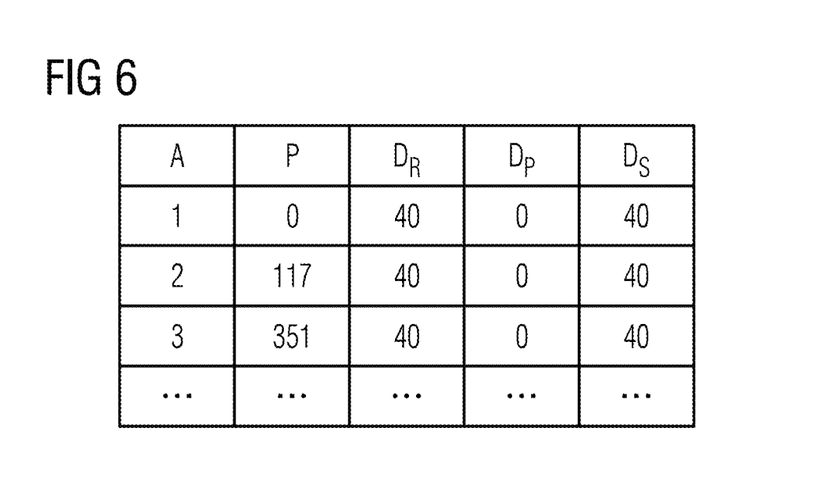
FIG. 6 shows a first sequence table in accordance with the invention.

On passing through the excitation cycles, the radio-frequency pulse 13 undergoes at least one phase change. Preferably, it passes through a sequence as indicated in FIG. 6. The radio-frequency pulse 13 is also frequency selective and the water signal or the fat signal can be suppressed by it. Accordingly, with use for other nuclei than protons, other components can be frequency-selectively suppressed.

A number of results are produced from FIG. 2: The phase-adjustable radio-frequency pulses 13 can be used in all sequences, that is imaging and spectroscopic sequences. They can be mixed with non-phase-adjustable or phase-adjustable radio-frequency pulses. Furthermore, the phase-adjustable radio-frequency pulses 13 can be configured frequency-selectively. The results can be converted independently of one another and in particular without restriction to the exemplary embodiment of FIG. 2.

Figure 3:
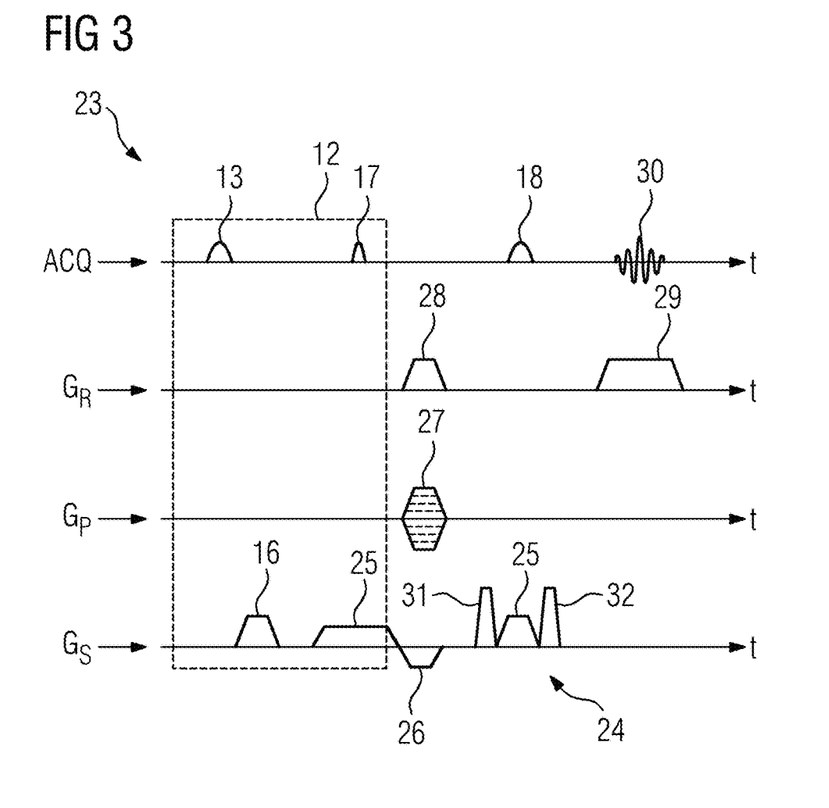
FIG. 3 shows a second scan sequence in accordance with the invention.

FIG. 3 shows a sequence diagram 17 of an imaging spin echo sequence. Included in the sequence diagram 23 is a saturation module 12 and an internal spoiler unit 24.

The saturation module 12 itself includes a first radio-frequency pulse 13 and a dephasing gradient 16. This is shown purely by way of example in the slice selection direction $G_s$ and, as shown in FIG. 2, further dephasing gradients can be used in the reading direction $G_R$ or the phase direction $G_P$.

The spin echo has as component parts, in known manner, a 90° excitation pulse in the form of a radio-frequency pulse 17, a refocusing pulse 18, a slice selection gradient 25, a slice rephasing gradient 26, a phase gradient 27, a reading dephasing gradient 28 and a reading gradient 29. By this means, an echo 30 is generated. The echo 30 is not a pure spin echo, but is an overlaid spin and gradient echo.

In order to remedy imperfections of the refocusing pulse 18, the spoiler unit 24 is used with two spoiler gradients 31 and 32. By means of the second spoiler gradient 32, the signal that has not been refocused by the refocusing pulse 18 is dephased.

The spoiler gradients 31 and 32 act entirely differently from the dephasing gradients 14, 15 or 16. The dephasing gradients eliminate the excited signal and only the imperfectly excited portions are not eliminated. With the spoiler gradients 31 and 32, spins that are perfectly rotated through 180° are not changed, while imperfectly excited signal portions are eliminated.

It can be seen from FIG. 3 that at least one dephasing gradient 16 must be present, although two or three or more dephasing gradients can also be used.

FIGS. 2 and 3 show saturation modules 12 in different embodiments. These can be exchanged without restriction, since they are modules. This means that the saturation module 12 according to FIG. 3 could also be used in exactly the same way in FIG. 2 and vice versa.

Figure 4:
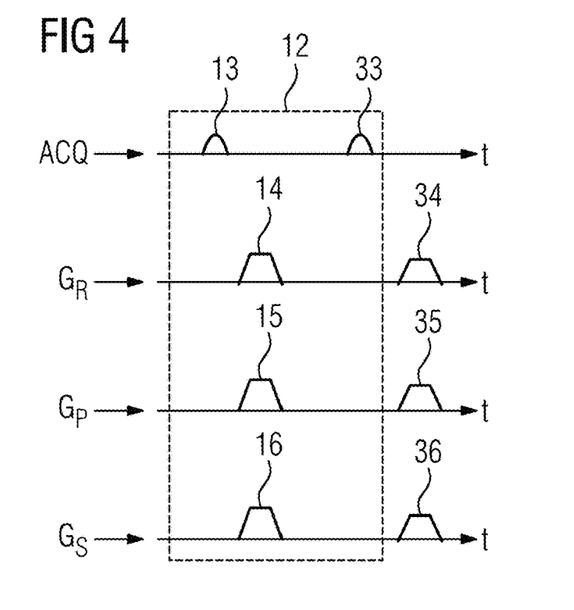
FIG. 4 shows a saturation module in a third embodiment in accordance with the invention.

FIG. 4 shows a further configuration possibility for a saturation module 12. In supplementation of FIGS. 2 and 3, this has a second radio-frequency pulse 33 and associated dephasing gradients 34, 35 and 36.

In order to interrupt the symmetry of the module, the dephasing gradients 34, 35 and 36 have another, herein smaller, gradient moment than the dephasing gradients 14, 15 and 16.

A second or even a third or fourth radio-frequency pulse can be used if, with the use of a single radio-frequency pulse, undesirable residual magnetization is still present in the saturation module.

Figure 5:
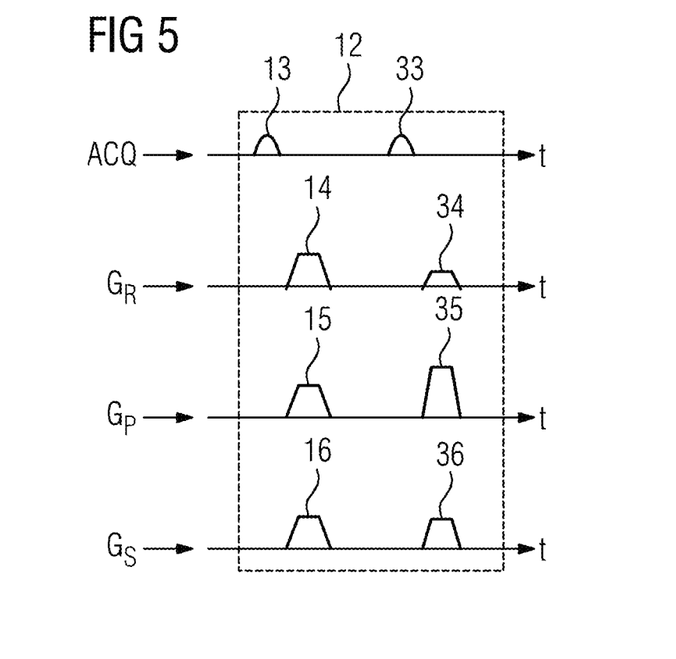
FIG. 5 shows a saturation module in a fourth embodiment in accordance with the invention.

FIG. 5 shows a further saturation module 12. The statements made in relation to FIG. 4 still apply except for the embodiment of the dephasing gradients 34, 35 and 36. These have different gradient moments among them for symmetry breaking. The dephasing gradient 16 and the dephasing gradient 36, however, have the same gradient moment.

The following rules on symmetry breaking can therefore be derived from FIGS. 2 to 5:

There exists at least one dephasing gradient. This changes the gradient moment at least once preferably on the basis of a predefined, preferably asymmetrical, sequence.

If a number of dephasing gradients 14, 15, 16 exist for a phase-adjustable radio-frequency pulse 13, asymmetries can be achieved by means of a plurality of measures: The simultaneously applied gradient moments with at least two dephasing gradients can be different. The consecutive gradient moments in two excitation cycles can be different. The dephasing gradients can pass through different sequences or the same sequence temporally offset. A temporal offset arises, for example, in that the predetermined sequence with the dephasing gradient 14 starts in the first excitation cycle, with the dephasing cycle 15 in the second excitation cycle and with the dephasing gradient 16 in the third excitation cycle.

Figure 7:
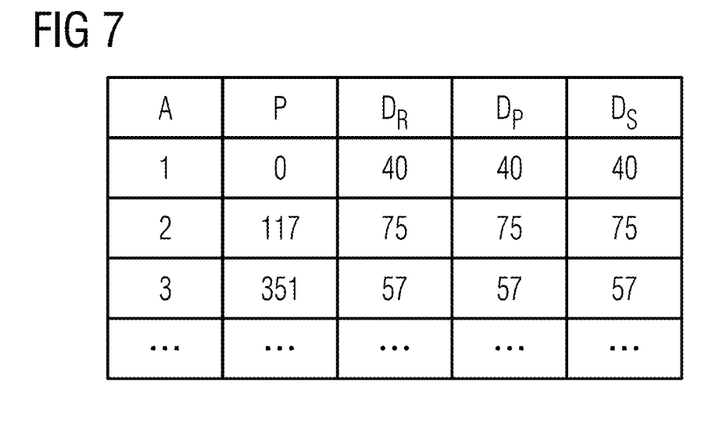
FIG. 7 shows a second sequence table in accordance with the invention.

There then result sequence tables as shown in FIGS. 6 and 7. The tables in FIGS. 6 to 10 have the columns "S" for slice number, "A" for the number of the excitation cycle, P, P1 and P2 for the specification of the phase, $D_R$, $D_P$ and $D_S$ for the specification of the gradient moment of the dephasing gradient in the reading, phase and slice selection directions. The gradient moment is herein given in relative units and the maximum applicable gradient moment has the value 100.

In FIGS. 6 to 10, in each case, only the initial values are shown, on the basis of which the further procedure and the systematization are already identifiable.

FIG. 6 shows a sequence table for a sequence with a phase-adjustable radio-frequency pulse 13, which carries out an RF spoiling. The phase P arises for the excitation cycles A on the basis of the formula set out above.

The dephasing gradients have constant gradient moments $D_R$ and $D_S$, a symmetry interruption takes place through the omission of the dephasing gradient in the phase direction.

The sequence table of FIG. 7 contains, apart from the RF spoiling, also a sequence for the dephasing gradients which have the reference signs 14, 15, 16, 34, 35 or 36 in FIGS. 2 to 5. This sequence of the gradient moments $D_R$, $D_P$ and $D_S$ is executed in parallel in FIG. 7. The sequence can naturally have more than the three elements shown.

Figure 8:
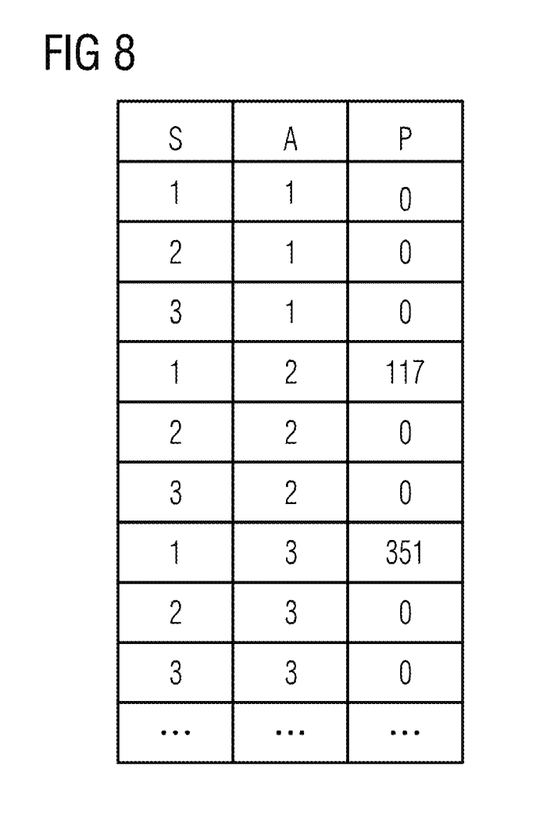
FIG. 8 shows a third sequence table in accordance with the invention.

FIG. 8 shows a sequence table for an RF spoiling with a plurality, here three, slices. For each slice S, a dedicated first excitation cycle A exists, so that the numbers of the excitation cycles repeat.

It is herein apparent that an RF spoiling can take place separately in each slice and does not take place in each slice, but only in at least one slice. The RF spoiling takes place in slice 1 as shown in FIGS. 6 and 7, whereas in slices 2 and 3, none takes place.

Figure 9:
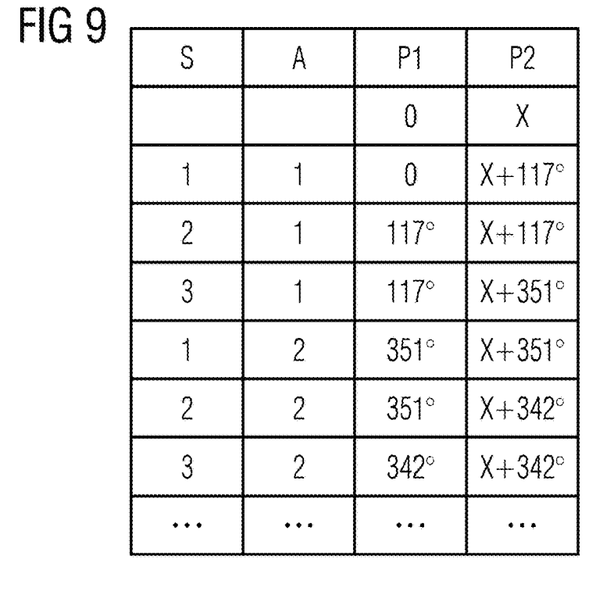
FIG. 9 shows a fourth sequence table in accordance with the invention.

FIG. 9 shows a sequence table for an RF spoiling for three slices with the use of two phase-adjustable radio-frequency pulses 13 and 33. Accordingly, there exist two phases P1 and P2. Which of the radio-frequency pulses 13 or 33 has which phase is herein fundamentally unimportant. A symmetry breaking results from three independent measures: firstly, the starting phases of the radio-frequency pulses 13 and 33 are offset. One of the two radio-frequency pulses 13 or 33 has an arbitrary starting phase X different from 0. This is different from 0 because the other radio-frequency pulse has this starting phase.

Secondly, the phase increments are offset to one another, wherein an increment takes place only on every third application of a radio-frequency pulse. Each phase, at least after the start-up phase, is used twice consecutively and then a change is made. The change for the radio-frequency pulses 13 and 33 is preferably undertaken in different excitation cycles.

Figure 10:
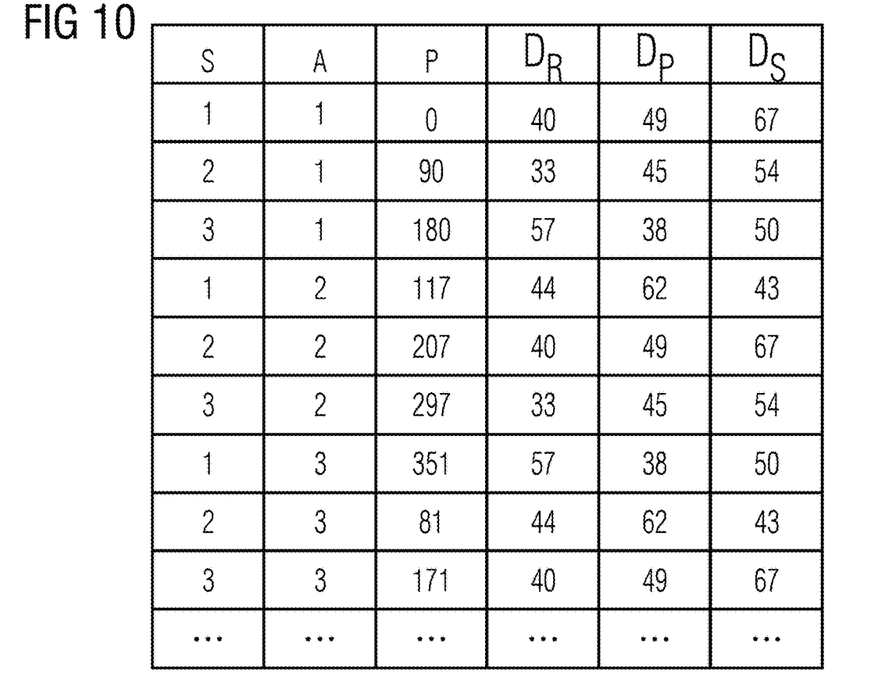
FIG. 10 shows a fifth sequence table in accordance with the invention.

FIG. 10 shows a further sequence table for a phase-adjustable radio-frequency pulse 13 and three slices.

With RF spoiling, phase increments are run through as shown in FIG. 6, wherein in each slice, a different starting phase is used.

The gradient spoiling takes place with three dephasing gradients which each pass through a sequence with four elements. Two independent steps are used for symmetry breaking: The sequences are displaced against one another and the values are separated by means of a fixed summand. In principle, the dephasing gradients can have different sequences of different length.

RF spoiling and gradient spoiling of respective individual spatial directions take place fundamentally independently of one another. For symmetry breaking, it can be determined that sequences which can also be present during RF spoiling, do not run entirely in parallel and also that no other symmetries arise.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating a magnetic resonance (MR) data record, comprising:

from a computer, providing controls signals to an MR data acquisition scanner so as to operate the data acquisition scanner to execute at least two excitation cycles by emitting a radio-frequency excitation pulse in each of said excitation cycles in order to produce, in each excitation cycle, at least one MR signal that is recorded in each excitation cycle;

from said computer, operating said MR data acquisition scanner with said control signals so as to cause said MR data acquisition scanner to emit said RF excitation pulse respectively in at least two consecutive excitation cycles with said RF excitation pulse having a different phase in the two consecutive excitation cycles;

from said computer, operating said MR data acquisition scanner with said control signals so as to activate at least one dephasing gradient in an excitation cycle; and entering the recorded MR signals into a memory as raw MR data, and making the raw MR data available in electronic form from the computer, as a data file for further processing thereof.

2. A method as claimed in claim 1 comprising, from said computer, operating said MR data acquisition scanner with said control signals so as to apply said at least one dephasing gradient immediately following the RF excitation pulse in a respective excitation cycle.

3. A method as claimed in claim 1 comprising, from said computer, operating said MR data acquisition scanner with said control signals so as to give said RF excitation pulse a flip angle in a range between 80° and 110°.

4. A method as claimed in claim 1 comprising, from said computer, operating said MR data acquisition scanner with said control signals so as to combine said RF excitation pulse and said at least one dephasing gradient to form a preparation module.

5. A method as claimed in claim 4 wherein said preparation module is a saturation module.

6. A method as claimed in claim 1 comprising, from said computer, operating said MR data acquisition scanner with said control signals so as to give said at least one dephasing gradient in said at least two consecutive excitation cycles a different gradient moment in the respective excitation cycles of said at least two consecutive excitation cycles.

7. A method as claimed in claim 6 comprising, from said computer, operating said MR data acquisition scanner with said control signals so as to activate said at least one dephasing gradient with a repeated sequence of respective gradient moments from excitation cycle-to- excitation cycle in said at least two consecutive excitation cycles.

8. A method as claimed in claim 6 comprising, from said computer, operating said MR data acquisition scanner with said control signals so as to activate the respective dephasing gradients with respective gradient moments that include a smallest gradient moment and a strongest gradient moment, with said smallest gradient moment being at least half as large as said strongest gradient moment.

9. A method as claimed in claim 1 comprising, from said computer, operating said MR data acquisition scanner with said control signals so as to give said RF excitation pulse a phase increment based on a formula, between said at least two consecutive excitation cycles.

10. A method as claimed in claim 1 comprising, from said computer, operating said MR data acquisition scanner with said control signals to acquire MR signals from a plurality of slices of a subject, with, in one excitation cycle, only a gradient moment of said at least one dephasing gradient being changed.

11. A method as claimed in claim 1 wherein said RF excitation pulse is a first RF excitation pulse and comprising, from said computer, operating said MR data acquisition scanner with said control signals to also emit at least one second RF pulse in each excitation cycle.

12. A method as claimed in claim 1 wherein said dephasing gradient is a first dephasing gradient and comprising, from said computer, operating said MR data acquisition scanner with said control signals so as to also activate a second dephasing gradient in each excitation cycle.

13. A method as claimed in claim 1 wherein said RF excitation pulse is a first RF excitation pulse and said dephasing gradient is a first dephasing gradient and comprising, from said computer, operating said MR data acquisition scanner so as to also emit, in each excitation cycle, at least one second RF excitation pulse and to activate a second dephasing gradient.

14. A non-transitory, computer-readable data storage medium encoded with programming instructions, said storage medium being loaded into a computer of a magnetic resonance (MR) apparatus comprising an MR data acquisition scanner, and said programming instructions causing said computer to:
provide controls signals to said MR data acquisition scanner so as to operate the data acquisition scanner to execute at least two excitation cycles by emitting a radio-frequency excitation pulse in each of said excitation cycles in order to produce, in each excitation cycle, at least one MR signal that is recorded in each excitation cycle;
operate said MR data acquisition scanner with said control signals so as to cause said MR data acquisition scanner to emit said RF excitation pulse respectively in at least two consecutive excitation cycles with said RF excitation pulse having a different phase in the two consecutive excitation cycles;
operate said MR data acquisition scanner with said control signals so as to activate at least one dephasing gradient in an excitation cycle; and
enter the recorded MR signals into a memory as raw MR data, and make the raw MR data available in electronic form from the computer, as a data file for further processing thereof.

15. A magnetic resonance (MR) apparatus comprising:
an MR data acquisition scanner; and
a computer configured to:
provide controls signals to said MR data acquisition scanner so as to operate the data acquisition scanner to execute at least two excitation cycles by emitting a radio-frequency excitation pulse in each of said excitation cycles in order to produce, in each excitation cycle, at least one MR signal that is recorded in each excitation cycle;
operate said MR data acquisition scanner with said control signals so as to cause said MR data acquisition scanner to emit said RF excitation pulse respectively in at least two consecutive excitation cycles with said RF excitation pulse having a different phase in the two consecutive excitation cycles;
operate said MR data acquisition scanner with said control signals so as to activate at least one dephasing gradient in an excitation cycle; and
enter the recorded MR signals into a memory as raw MR data, and make the raw MR data available in electronic form from the computer, as a data file for further processing thereof.

* * * * *